(12) United States Patent
Hartig

(10) Patent No.: US 7,264,741 B2
(45) Date of Patent: Sep. 4, 2007

(54) COATER HAVING SUBSTRATE CLEANING DEVICE AND COATING DEPOSITION METHODS EMPLOYING SUCH COATER

(75) Inventor: Klaus Hartig, Avcoa, WI (US)

(73) Assignee: Cardinal CG Company, Eden Prairie, MN (US)

( * ) Notice: Subject to any disclaimer, the term of this patent is extended or adjusted under 35 U.S.C. 154(b) by 158 days.

(21) Appl. No.: 10/750,337

(22) Filed: Dec. 31, 2003

(65) Prior Publication Data

US 2004/0175511 A1 Sep. 9, 2004

Related U.S. Application Data

(60) Provisional application No. 60/437,518, filed on Dec. 31, 2002.

(51) Int. Cl.
*B44C 1/22* (2006.01)
*C23C 14/00* (2006.01)
*C23C 14/32* (2006.01)
*C23C 16/00* (2006.01)
*B05D 1/00* (2006.01)

(52) U.S. Cl. ............ 216/37; 216/66; 156/345.31; 156/345.39; 204/192.11; 204/192.34; 204/298.04; 204/298.25; 204/298.26; 204/298.35; 204/298.36; 427/255.5; 427/532; 427/533; 427/209; 427/210

(58) Field of Classification Search ............ 216/37, 216/66; 118/718, 719; 156/345.31, 345.39; 204/192.11, 192.34, 298.04, 298.23, 298.35–6; 427/255.5, 532–533, 209–210; 65/67

See application file for complete search history.

(56) References Cited

U.S. PATENT DOCUMENTS 3,904,506 A 9/1975 Carmichael et al. ........ 204/298

(Continued)

FOREIGN PATENT DOCUMENTS

WO WO 00/37376 6/2000

(Continued)

OTHER PUBLICATIONS

Keem, Dr. John "Deposition and Surface Modification With Anode Layer Ion Sources" *Veeco Instruments and Society of Vacuum Cleaners* (PSE Presentation, (Sep. 11, 2002).

(Continued)

*Primary Examiner*—Karla Moore
(74) *Attorney, Agent, or Firm*—Fredrikson & Byron, P.A.

(57) ABSTRACT

A coater having a substrate cleaning device is disclosed. Also disclosed are methods of processing substrates in a coater equipped with a substrate cleaning device. The substrate cleaning device comprises an ion gun (i.e., an ion source) that is positioned beneath a path of substrate travel (e.g., beneath a substrate support) extending through the coater and that is adapted for treating a bottom major surface of a substrate. Certain embodiments involve an upward coating apparatus that is further along the path of substrate travel than the substrate cleaning device. In some embodiments of this nature, the upward coating apparatus is configured for depositing a photocatalytic coating upwardly onto the bottom major surface of the substrate. Certain embodiments of the invention involve a downward coating apparatus, wherein the substrate cleaning device is further along the path of substrate travel than the downward coating apparatus. Some embodiments of this nature also involve an upward coating apparatus that is further along the path of substrate travel than the substrate cleaning device.

50 Claims, 6 Drawing Sheets

U.S. PATENT DOCUMENTS

| | | | |
|---|---|---|---|
| 3,925,182 A | 12/1975 | Carmichael et al. | 204/192 |
| 3,968,018 A | 7/1976 | Lane et al. | 204/192 |
| 4,214,972 A | 7/1980 | Shintock | 204/298 |
| 4,604,181 A | 8/1986 | Mirtich et al. | 204/298 |
| 5,054,421 A | 10/1991 | Ito et al. | 118/723 |
| 5,273,634 A | 12/1993 | Fukui et al. | 204/192.34 |
| 5,424,130 A | 6/1995 | Nakanishi et al. | 428/410 |
| 5,616,532 A | 4/1997 | Heller et al. | 502/242 |
| 5,853,866 A | 12/1998 | Watanabe et al. | 428/312.8 |
| 5,874,701 A | 2/1999 | Watanabe et al. | 204/157.15 |
| 5,879,519 A | 3/1999 | Seeser et al. | 204/192.12 |
| 5,939,194 A | 8/1999 | Hashimoto et al. | 428/411.1 |
| 5,958,134 A * | 9/1999 | Yasar et al. | 118/50 |
| 5,961,843 A | 10/1999 | Hayakawa et al. | 210/748 |
| 5,969,470 A | 10/1999 | Druz et al. | 313/359.1 |
| 5,982,101 A | 11/1999 | Fremgen, Jr. et al. | 315/111.91 |
| 6,013,372 A | 1/2000 | Hayakawa et al. | 428/411.1 |
| 6,090,489 A | 7/2000 | Hayakawa et al. | 428/409 |
| 6,139,803 A | 10/2000 | Watanabe et al. | 422/121 |
| 6,150,755 A | 11/2000 | Druz et al. | 313/359.1 |
| 6,165,256 A | 12/2000 | Hayakawa et al. | 106/13 |
| 6,171,659 B1 | 1/2001 | Vanden Brande et al. | 427/523 |
| 6,191,062 B1 | 2/2001 | Hayakawa et al. | 502/159 |
| 6,210,779 B1 | 4/2001 | Watanabe et al. | 428/208 |
| 6,224,718 B1 | 5/2001 | Meyer | 204/192.12 |
| 6,225,747 B1 | 5/2001 | Fremgen, Jr. et al. | 315/111.91 |
| 6,368,664 B1 | 4/2002 | Veerasamy et al. | 427/249.7 |
| 6,652,974 B1 | 11/2003 | Krisko | 428/428 |
| 6,660,365 B1 | 12/2003 | Krisko et al. | 428/149 |
| 2002/0102352 A1 | 8/2002 | Hartig et al. | 427/165 |
| 2004/0020761 A1 | 2/2004 | Thomsen et al. | 204/192.12 |

FOREIGN PATENT DOCUMENTS

| | | |
|---|---|---|
| WO | WO 00/37377 | 6/2000 |
| WO | WO 02/00564 A | 1/2002 |
| WO | WO 02/05708 A2 | 1/2002 |
| WO | WO 03/095695 A | 11/2003 |

OTHER PUBLICATIONS

Blacker, Richard, et al. "Ion Bean Precleaning of Glass with ALS" *Veeco Instruments 4th International Conference of Coatings on Glass Presentation* (Nov. 2002).

* cited by examiner

COATER HAVING SUBSTRATE CLEANING DEVICE AND COATING DEPOSITION METHODS EMPLOYING SUCH COATER

This application claims the benefit of U.S. Provisional Application No. 60/437,518, filed 31 Dec. 2002.

FIELD OF THE INVENTION

The present invention provides a coater in which coatings are applied to substrates. Also provided are methods of depositing coatings on substrates. More specifically, the invention provides a coater and methods in which thin films are applied to glass sheets or other sheet-like substrates.

BACKGROUND OF THE INVENTION

The bottom surface of a sheet-like substrate (e.g., a glass sheet) can be contaminated in situ (i.e., while the substrate is inside a coater) due to overspray from a downward coating operation. For example, when material is sputtered downwardly onto the top surface of a substrate, some of the sputtered material can actually find its way onto the substrate's bottom surface. This overspray phenomenon has been found to leave unwanted coating on marginal portions of the substrate's bottom surface. This can create an undesirable "picture frame" effect on the substrate. Thus, when a downward coating operation is performed on a substrate, it would be desirable to provide means for cleaning (e.g., removing any unwanted oversprayed coating from) the substrate's bottom surface after the downward coating operation is performed. It would be particularly desirable to provide in situ means (i.e., means inside a coater) for cleaning the bottom surface of a substrate after its top surface has been coated by a downward coating operation.

Further, when a desired coating is applied to the bottom surface of a substrate by an upward coating operation after the top surface of the substrate has been coated by a downward coating operation, the marginal portions of the bottom surface can end up carrying both the desired coating and unwanted overspray from the downward coating operation, while the central portion of this surface carries only the desired coating. The resulting non-uniformity/picture frame effect, even if not discernable with the naked eye, is undesirable in that it can throw the coated substrate outside desired specifications. Thus, when a downward coating operation is performed prior to an upward coating operation, it would be particularly desirable to provide means for cleaning the bottom surface after the downward coating operation but before the upward coating operation.

Applying coating in an upward direction onto the bottom surface of a substrate can be highly advantageous. Upward coating operations can be advantageously performed in a coater in addition, or as an alternative, to downward coating operations. Particularly advantageous upward sputtering methods and equipment are described in U.S. patent application Ser. Nos. 09/868,542, 09/868,543, 09/979,314, 09/572,766, and 09/599,301, the entire contents of each of which are incorporated herein by reference. In conjunction with upward coating technology, it would be desirable to provide means for cleaning the bottom surface of a substrate before (preferably shortly before) such surface is coated by an upward coating operation. It would be particularly desirable to provide in situ means for cleaning the bottom surface of a substrate before such surface is coated by an upward coating operation.

When a substrate is transported through a coater using a substrate support, the substrate can be left with traces of contact from the support. Substrates are commonly conveyed through coaters using spaced-apart transport rollers, such that the bottom surface of each substrate is in direct contact with the rollers during conveyance. The rollers can leave traces of contact on the bottom surface of each substrate. While these traces of contact tend to be relatively minor (and completely acceptable for many applications), it would be desirable to provide means for assuring that any such traces of contact are completely removed from the bottom surface of the substrate before such surface is coated by an upward coating operation.

It would be particularly desirable to perform an ion beam treatment on the bottom surface of a substrate before applying a photocatalytic coating to such surface by an upward coating operation. This is done in certain embodiments of the present invention, for example, to facilitate depositing a high quality photocatalytic coating. This method is particularly preferred in embodiments wherein it is desired to deposit a particularly thin high quality photocatalytic coating.

SUMMARY OF THE INVENTION

In certain embodiments, the invention provides a coater adapted for applying coating onto a sheet-like substrate. The coater comprises a substrate support defining a path of substrate travel extending through the coater. The coater also comprises an ion gun positioned beneath the path of substrate travel and adapted for cleaning a bottom major surface of the substrate. In some embodiments, the coater further includes an upward coating apparatus positioned beneath the path of substrate travel at a location further along the path of substrate travel than the ion gun. In one particular embodiment of this nature, the upward coating apparatus is an upward sputtering apparatus that includes a lower sputtering target comprising a titanium-containing target material.

In certain embodiments, the invention provides a method of processing a sheet-like substrate. The method comprises providing a coater adapted for applying coating onto the substrate. The coater comprises a substrate support defining a path of substrate travel extending through the coater. The coater also comprises an ion gun positioned beneath the path of substrate travel. The substrate is conveyed along the path of substrate travel and the ion gun is operated to emit ions (e.g., upwardly) toward a bottom major surface of the substrate. The ions preferably comprise accelerated ions that form an ion beam (e.g., a focused ion beam) and strike the bottom major surface of the substrate, thereby treating (e.g., cleaning) the substrate's bottom major surface. In some embodiments, the coater further includes an upward coating apparatus positioned beneath the path of substrate travel at a location further along the path of substrate travel than the ion gun. In one particular embodiment of this nature, the upward coating apparatus is operated to apply a photocatalytic coating on the previously ion-treated bottom major surface of the substrate.

Certain embodiments of the invention provide a method of processing a sheet-like substrate. In these embodiments, the method comprises providing a coater that is adapted for applying coating onto the substrate. The coater comprises a substrate support defining a path of substrate travel extending through the coater. A downward coating apparatus is positioned in the coater above the path of substrate travel. An ion gun is positioned beneath the path of substrate travel. In the present embodiments, the ion gun is at a location further along the path of substrate travel than the downward coating apparatus (preferably, this ion gun is not vertically aligned with any downward coating apparatus). The method comprises conveying the substrate along the path of substrate travel, operating the downward coating apparatus to coat a top major surface of the substrate, and thereafter operating the ion gun to emit an ion beam toward a bottom major surface of the substrate. Here, the operation of the ion gun is performed to remove, substantially if not entirely, from the bottom major surface of the substrate any oversprayed coating that was inadvertently deposited upon marginal portions of the bottom major surface of the substrate during the operation of the downward coating apparatus (in some cases, also shaving off some of the substrate material). In the present embodiments, the coater need not have any upward coating apparatus.

Certain embodiments of the invention provide a coater adapted for applying coating onto a sheet-like substrate. In these embodiments, the coater comprises a substrate support defining a path of substrate travel extending through the coater. A downward coating apparatus is positioned above the path of substrate travel and is adapted for coating a top major surface of the substrate. An ion gun is positioned beneath the path of substrate travel and is adapted for cleaning a bottom major surface of the substrate. In the present embodiments, the ion gun is at a location further along the path of substrate travel than the downward coating apparatus such that the ion gun is adapted to remove, substantially if not entirely, from the bottom major surface of the substrate oversprayed coating inadvertently deposited upon marginal portions of the bottom major surface of the substrate during operation of the downward coating apparatus. In the present embodiments, the coater need not have any upward coating apparatus.

In certain embodiments, the invention provides a method of processing a sheet-like substrate. In these embodiments, the method comprises providing a coater adapted for applying coating onto the substrate. The coater comprises a substrate support defining a path of substrate travel extending through the coater. An ion gun is positioned beneath the path of substrate travel. In the present embodiments, an upward coating apparatus is positioned beneath the path of substrate travel at a location further along the path of substrate travel than the ion gun. The method comprises conveying the substrate along the path of substrate travel, operating the ion gun to emit ions (e.g., an ion beam) toward a bottom major surface of the substrate (preferably such ions form an ion beam comprising accelerated ions that strike the bottom major surface of the substrate), and operating the upward coating apparatus to deposit a photocatalytic coating on the bottom major surface of the substrate. In the present embodiments, the coater need not have any downward coating apparatus.

Certain embodiments of the invention provide a coater adapted for applying coating onto a sheet-like substrate. The coater comprises a substrate support defining a path of substrate travel extending through the coater. An ion gun is positioned beneath the path of substrate travel. In these embodiments, an upward coating apparatus is positioned beneath the path of substrate travel at a location further along the path of substrate travel than the ion gun. In the present embodiments, the upward coating apparatus preferably comprises a titanium-containing source material (e.g., a lower sputtering target comprising a titanium-containing target material). In the present embodiments, the coater need not have any downward coating apparatus.

DETAILED DESCRIPTION OF PREFERRED EMBODIMENTS

Figure 1:
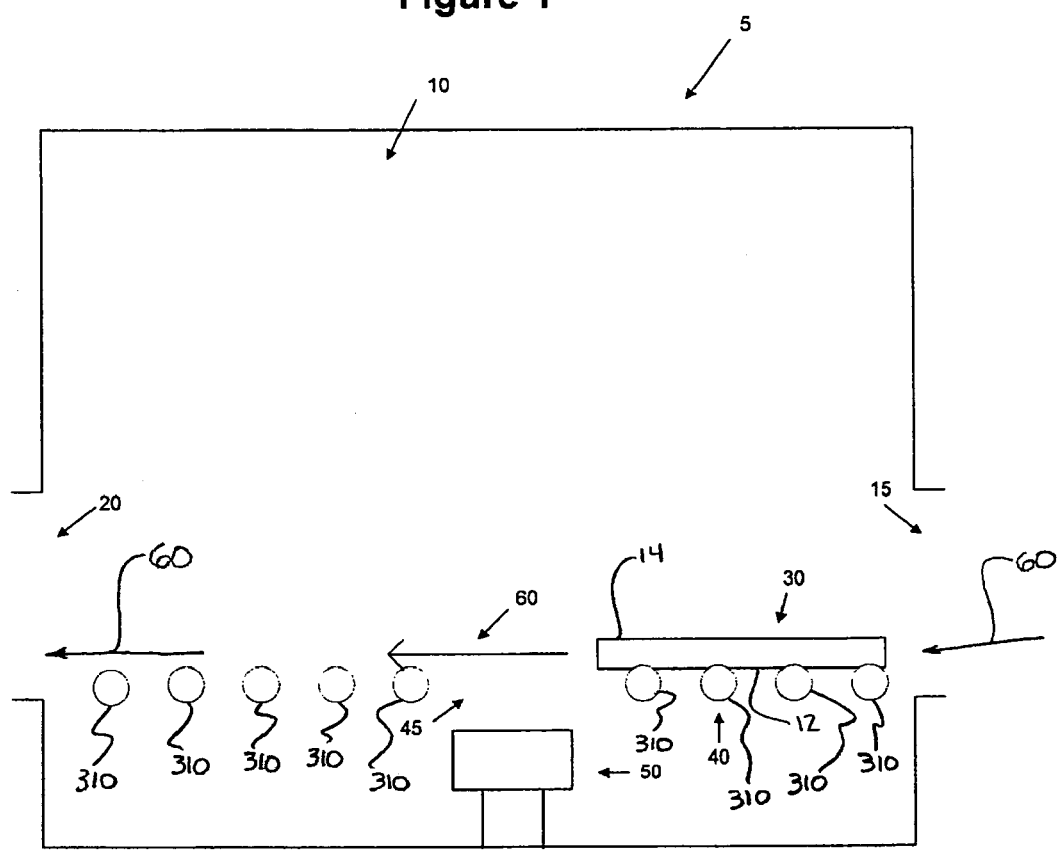
FIG. 1 illustrates a coater having disposed therein an ion gun in accordance with certain embodiments of the present invention.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

The present invention involves a coater 5 adapted for applying coating onto a sheet-like substrate 30. As shown in FIG. 1, the coater 5 includes at least one chamber 10 in which a controlled environment can be established. Preferably, the chamber is adapted for use in low pressure deposition processes (e.g., in vacuum deposition processes). For example, the chamber 10 preferably is adapted for use at (e.g., is adapted for establishing and maintaining therein) a total gas pressure of less than about 140 torr., more preferably less than about 0.1 torr., and perhaps most commonly between about 1 mtorr. and about 0.1 torr. (e.g., between about 1 mtorr. and about 30 mtorr.). Thus, in certain embodiments, the chamber 10 is adapted for use at (e.g., is provided with conventional gas delivery and pumping systems adapted for establishing and maintaining) pressures within any range or ranges described in this paragraph.

The coater comprises one or more chambers. It will be apparent to skilled artisans that any desired number of chambers can be used. In some cases, the coater comprises a series of connected chambers. For example, the coater may comprise a sputtering line. Sputtering lines are well known in the present art. Briefly, a sputtering line comprises a series of sputtering chambers aligned and connected such that sheet-like substrates (e.g., a plurality of spaced-apart substrates, such as glass sheets) supported horizontally on spaced-apart transport rollers can be conveyed sequentially through the chambers of the sputtering line. Typically, the sputtering line includes narrow evacuated tunnels, which connect adjacent chambers, through which the horizontally-oriented substrates are conveyed from one chamber to the next. Thus, substrates are typically conveyed sequentially through all of the chambers of a sputtering line during sputtering. It will be appreciated that the present coater 5 may include a plurality of chambers aligned and connected in this manner, regardless of the particular deposition processes that are performed in such chambers.

The present coater 5 can include chambers adapted for carrying out different deposition processes. For example, the coater can include one or more chambers in which sputtering is performed and one or more chambers in which evaporation is performed. Further, the coater can include one or more chambers in which sputtering is performed and one or more chambers in which chemical vapor deposition is performed. Similarly, the coater can include one or more chambers in which sputtering is performed and one or more chambers in which ion beam coating deposition is performed. Still further, the coater can include one or more chambers in which chemical vapor deposition is performed and one or more chambers in which evaporation is performed. Various alternatives of this nature will be apparent to skilled artisans given the present teaching as a guide.

A variety of substrates are suitable for use in the present invention. In most cases, the substrate is a sheet of transparent material (i.e., a transparent sheet). However, the substrate is not required to be transparent. For example, opaque substrates may be useful in some cases. However, it is anticipated that for most applications, the substrate will comprise a transparent or translucent material, such as glass or clear plastic. In many cases, the substrate will be a glass sheet. A variety of known glass types can be used, and soda-lime glass is expected to be preferred.

Substrates of various size can be used in the present invention. An advantage of the coater 5 is that it can be used to process large-area substrates. Certain embodiments involve a substrate having a width of at least about 0.5 meter, preferably at least about 1 meter, perhaps more preferably at least about 1.5 meters (e.g., between about 2 meters and about 4 meters), and in some cases at least about 3 meters.

Substrates of various thickness can be used in the present invention. Commonly, substrates with a thickness of about 1-5 mm are used. Some embodiments involve a substrate with a thickness of between about 2.3 mm and about 4.8 mm, and perhaps more preferably between about 2.5 mm and about 4.8 mm. In some cases, a sheet of glass (e.g., soda-lime glass) with a thickness of about 3 mm is used.

Figure 2:
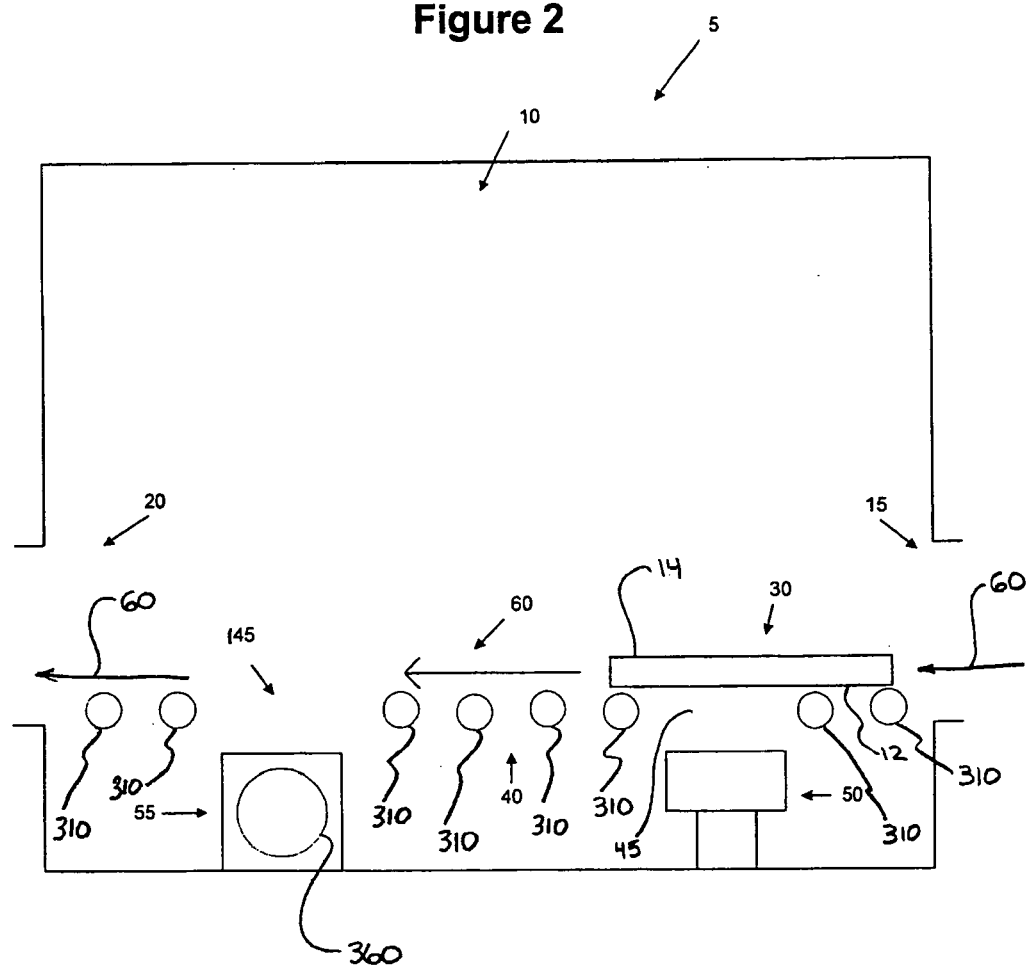
FIG. 2 illustrates a coater having disposed therein an ion gun and an upward coating apparatus in accordance with certain embodiments of the invention.
Figure 3:
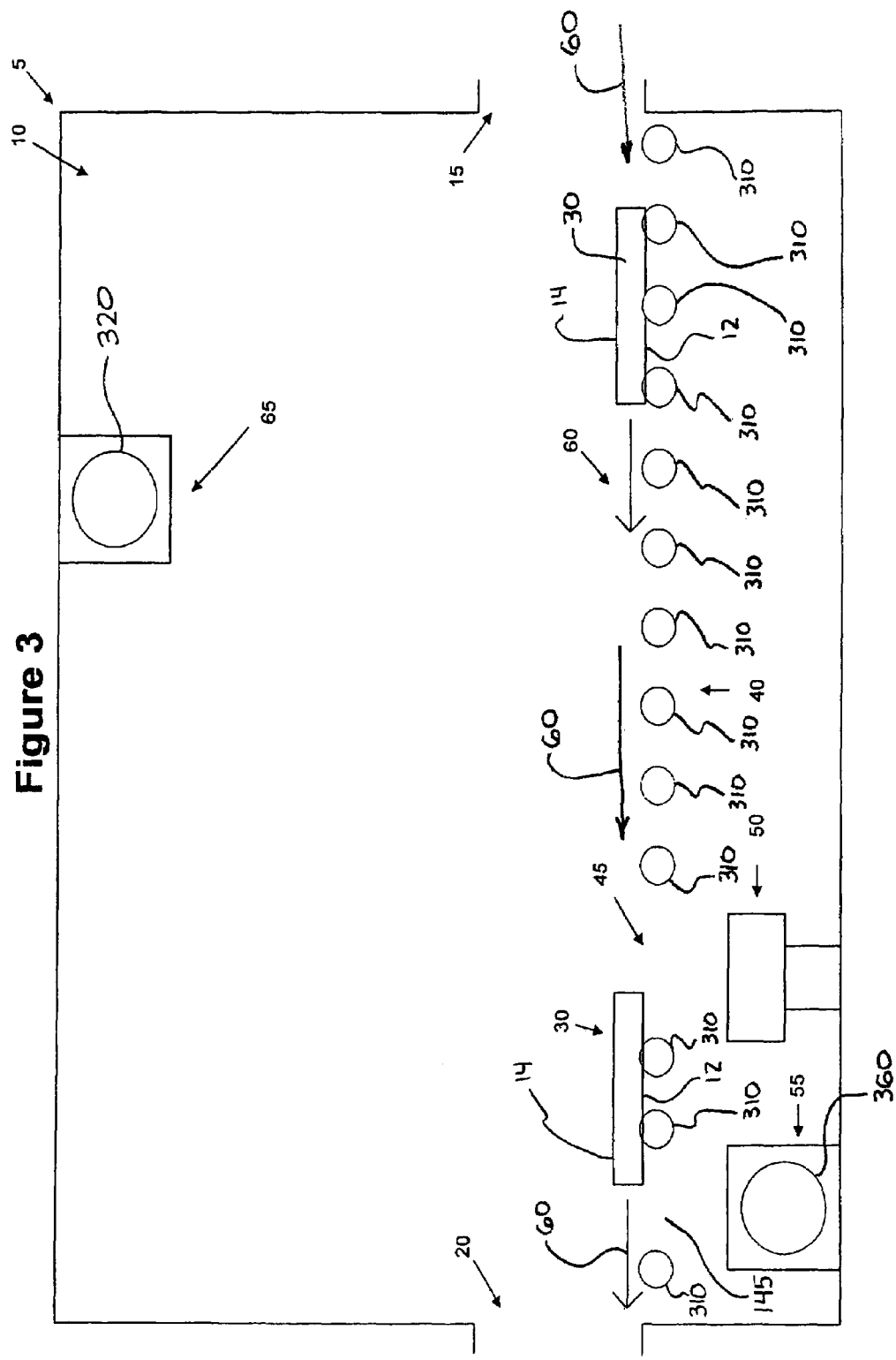
FIG. 3 illustrates a coater having disposed therein a downward coating apparatus, an ion gun, and an upward coating apparatus in accordance with certain embodiments of the invention.

The coater 5 comprises a substrate support 40 defining a path of substrate travel 60 extending through the coater. Preferably, the path of substrate travel extends substantially horizontally through the coater. In the embodiments of FIGS. 1-3, the substrate support 40 defines a path of substrate travel 60 extending through the coater 5 between a chamber inlet 15 and a chamber outlet 20. In embodiments wherein the coater 5 comprises more than one chamber, the chambers are typically connected such that the path of substrate travel 60 extends through each of the chambers between a coater inlet and a coater outlet.

Preferably, the substrate support 40 is configured for maintaining (e.g., supporting) the substrate in a horizontal configuration while the substrate is being coated (e.g., during conveyance of the substrate through the coater). Thus, the support 40 desirably is adapted to convey a sheet-like substrate 30, and preferably multiple sheet-like substrates that are spaced-apart from one another, through the coater while maintaining the/each substrate 30 in a horizontal orientation (e.g., wherein a top major surface 14 of the/each substrate 30 is upwardly oriented while a bottom major surface 12 of the/each substrate 30 is downwardly oriented). In the embodiments shown in the present figures, the substrate support 40 comprises a plurality of spaced-apart transport rollers 310. Typically, at least one of the rollers is rotated (e.g., by energizing a motor operably connected to the roller) such that the substrate 30 is conveyed through the chamber 10 along the path of substrate travel 60. When the substrate is conveyed over such rollers, the bottom surface 12 of the substrate 30 is in direct physical (i.e., supportive) contact with the rollers. The substrate is typically conveyed through the coater at a speed of about 100-500 inches per minute. In FIGS. 3-6, embodiments are illustrated wherein the substrate is a sheet of glass that is on the substrate support during conveyance, and wherein other sheets of glass are also on the substrate support, such sheets of glass being spaced-apart from one another on the substrate support and conveyed in such a spaced-apart configuration. While the illustrated substrate support 40 comprises a plurality of spaced-apart rollers 310, it is to be appreciated that other types of substrate supports can be used.

In embodiments wherein the substrate support 40 is formed by transport rollers, the rollers can be of any conventional structure. It has been found that good results can be obtained by employing cylindrical (e.g., aluminum) rollers about which a rope is spirally wound, with such rope providing the surface with which the substrate is in direct contact. The rope can be formed of Kevlar™, i.e., poly-para-phenylene terephthalamide, or another polymer (e.g., nylon-like polymer). Preferably, a high melting point polymer is used (e.g., a polymer having a melting point above the maximum processing temperature established in a desired deposition process, e.g., at least about 165 degrees C., more preferably at least about 200 degrees C., and perhaps optimally at least about 400 degrees C.). Rollers carrying a spirally-wound rope (or a plurality of individual bands) are particularly desirable for embodiments wherein an upward coating process is performed, as the rope reduces the area of contact between the rollers and the substrate and thus provides a particularly non-damaging support for the substrate's freshly-coated bottom surface. Thus, in certain embodiments, the substrate support 60 comprises a plurality of spaced-apart rollers each having at least one rope disposed about the roller.

In the embodiment of FIG. 1, an ion gun 50 is positioned beneath (i.e., at a lower elevation than) the path of substrate travel 60. The ion gun preferably is disposed within (i.e., inside) the coater 5. For example, the ion gun 50 can be disposed within a chamber 10 of the coater 5 that is adapted for use at a total gas pressure of less than about 140 torr., more preferably less than about 0.1 torr., and perhaps most commonly between about 1 mtorr. and about 0.1 torr. (e.g., between about 1 mtorr. and about 30 mtorr.). The ion gun 50 can be mounted within such a chamber 10 by any conventional means (e.g., using any convention mounting hardware). For example, the ion gun can be secured to a flange or flanges extending from a floor and/or sidewall of the coater.

The mounted ion gun preferably is adapted for treating (e.g., for accelerating ions at) the bottom surface of the substrate 30 as it is conveyed along the path of substrate travel 60. Thus, the mounted ion gun preferably is positioned beneath the path of substrate travel 60, such that when the ion gun 50 is operated it emits (e.g., upwardly between two spaced-apart transport rollers) ions, preferably a beam of ions, toward the bottom major surface 12 of the substrate 30. It will be appreciated that the ion gun 50 will typically be operated when the substrate 30 is on the support 40 at a portion of the path of substrate travel 60 adjacent (e.g., directly above) the ion gun.

The ion gun 50 desirably is adapted for emitting ions that span (e.g., an ion beam that spans) substantially the entire width (preferably the entire width) of the substrate 30. For example, the ion gun preferably emits a curtain-like ion beam that spans the entire width of the substrate's bottom major surface 12. Thus, the ion gun 50 preferably is adapted for treating (e.g., cleaning) the entire bottom surface 12 of the substrate 30. This can be accomplished in several ways. One way is by providing a single ion gun (which may have one ion source or multiple ion sources) that is capable of generating an ion beam or beams spanning substantially the entire width (preferably the entire width) of the substrate. Another way is to provide a plurality of ion guns, which together generate a collective ion beam or beams spanning substantially the entire width of the substrate. For example, two or more ion guns can be configured and operated such that their combined beams span the entire width of the substrate.

The invention is particularly advantageous in processing large area substrates, such as glass sheets for architectural and automotive glass applications. Substrates of this nature commonly have a width of at least about .5 meter, more commonly at least about one meter, and typically greater than about 1.5 meters (e.g., between about 2 meters and about 4 meters). Accordingly, the ion gun 50 is preferably adapted to emit an ion beam that spans the entire width of such a substrate (i.e., a substrate having a width in one or more of these ranges). With large area substrates in particular (especially those formed of glass), it is desirable to convey the substrates through the coater in a horizontal orientation, rather than in a vertical orientation.

The ion gun 50 can be any ion source. In certain preferred embodiments, the ion gun is adapted to ionize gas molecules and then focus, accelerate, and emit them as a narrow beam (i.e., as an ion beam). For example, the ion gun can be a linear ion source. The ion gun, however, is by no means required to emit ions in the form of a beam. Some ion guns are not operable in low pressure environments (e.g., under vacuum conditions). The present ion gun 50, however, preferably is operable in low pressure environments (e.g., in a vacuum deposition chamber). For example, the ion gun 50 is preferably adapted to operate in environments having a total gas pressure of less than about 140 torr., more preferably less than about 0.1 torr., and perhaps most commonly between about 1 mtorr. and about 0.1 torr. (e.g., between about 1 mtorr. and about 30 mtorr.).

The present ion gun is preferably one that accelerates ions electrodynamically, rather than electrostatically. The use of electrostatic fields to transfer, collect, or manipulate ions is well known. Typically, electrostatic fields are used with ion guns that operate at or near atmospheric pressure. Electrostatic fields tend to be less desirable for ion guns that operate in low pressure environments (e.g., under vacuum). To the contrary, electrodynamic fields are more effective for accelerating ions in low pressure environments. In certain preferred embodiments, therefore, the ion gun comprises an ion source that accelerates ions electrodynamically.

In certain particularly preferred embodiments, the ion gun 50 is an anode layer ion source. Anode layer ion sources accelerate ions electrodynamically, rather than electrostatically. As a result, they are desirable for use in low pressure environments. Further, anode layer ion sources are compatible with a wide variety of working gases, including argon, oxygen, nitrogen, hydrocarbons, and mixtures of such gases. Suitable ion sources of this nature are commercially available from Veeco (Ft. Collins, Colo., USA) under the trade names ALS 106C, ALS 144L, ALS 340L, ALS 340W. Reference is made to U.S. Pat. No. 6,147,354 (Maishev et al.), the entire contents of which are incorporated herein by reference, in which there is described operation of an anode-layer type ion source in a vacuum chamber.

With continued reference to FIG. 1, it can be appreciated that the ion gun 50 is disposed within the coater 5. As noted above, the ion gun 50 may be provided (e.g., mounted) in a chamber 10 of the coater 5 that is adapted for use at a total gas pressure of less than about 140 torr., more preferably less than about 0.1 torr., and perhaps most commonly between about 1 mtorr. and about 0.1 torr. (e.g., between about 1 mtorr. and about 30 mtorr.).

In embodiments wherein the substrate support 40 is provided in the form of spaced-apart transport rollers 310, the spacing of the rollers 310 is preferably kept fairly small to permit small substrates to be processed without any significant risk of having the substrates fall between the spaced-apart rollers. The maximum safe spacing is preferably determined on a case-by-case basis for a desired range of substrate sizes.

The ion gun 50 and the rollers 310 preferably are configured such that the ion gun 50 is adapted to emit an ion beam upwardly between an adjacent pair of the rollers (this pair of rollers preferably is generally above the ion gun). It can be appreciated that there is a gap 45 between these two rollers. If so desired, this pair of rollers can be spaced further apart than other rollers in the coater 5, such that this particular gap 45 is wider than other such gaps in the coater. This may be done to minimize any interference of the rollers with the ion beam.

Thus, in certain embodiments the ion gun 50 is positioned beneath a portion of the path of substrate travel 60 where an adjacent pair of rollers are mounted further apart than other adjacent rollers in the coater. In such embodiments, there is a gap 45 between the two rollers generally above/over the ion gun 50 that is wider than the gaps between other adjacent roller pairs in the coater 5. In such embodiments, the rollers in other areas of the chamber 10 can have conventional spacing.

It may also be desirable if certain rollers in the chamber 10 are removable, such that the chamber 10 can be readily converted between a first configuration, wherein a particularly wide gap 45 is provided between the two transport rollers nearest the ion gun, and a second configuration having a conventional roller arrangement wherein all of the rollers are evenly spaced.

Instead of mounting the rollers above the ion gun 50 further apart, these rollers could instead be made smaller in diameter. Conventional transport rollers are hollow metal tubes. If so desired, particularly small diameter tubes could be used. In such cases, it may be desirable to stiffen the rollers, e.g., by filling them with rigid foam. In order to maintain the same transport speed of a substrate along the support 60, these small-diameter rollers could be rotated more rapidly, e.g., by means of a pair of gears having an appropriate gear ratio. In one embodiment, the two rollers between which the ion gun 50 emits ions are smaller (i.e., have a smaller diameter) than other rollers in the coater. While the foregoing embodiments are expected to be advantageous, it is to be understood that the ion gun 50 can simply be aligned beneath a gap that results from conventional roller spacing.

As can be appreciated with reference to FIGS. 2-5, the coater 5 in certain embodiments includes an upward coating apparatus 55. When provided, the upward coating apparatus 55 is adapted for coating the bottom major surface 12 of the substrate 30. In embodiments of this nature, the ion gun 50 and the upward coating apparatus 55 are preferably both disposed (e.g., mounted) within the coater 5. If so desired, the ion gun 50 and an upward coating apparatus 55 can both be disposed in a common chamber (i.e., in the same chamber) of the coater 5. This, however, is by no means required. The ion gun 50 and the upward coating apparatus 55, when it 55 is provided, are preferably both positioned beneath (i.e., at a lower elevation than) the path of substrate travel 60.

In certain particularly advantageous embodiments, an upward coating apparatus 55 is positioned (e.g., mounted) at a location further along the path of the substrate travel 60 than the ion gun 50. By positioning an upward coating apparatus 55 at a location further along the path of substrate travel 60 than the ion gun 50, the ion gun is adapted for treating (e.g., cleaning) the bottom major surface 12 of the substrate 30 before the upward coating apparatus is operated to coat the bottom major surface of the substrate.

When provided, the upward coating apparatus 55 is preferably positioned beneath a gap 145 between an adjacent pair of transport rollers 310. This gap 145 may result from conventional roller spacing. Alternatively, this gap 145 may be wider than the gaps between other adjacent roller pairs in the coater 5. This can be accomplished in the manner described above with reference to the transport rollers over the ion gun (i.e., by mounting the rollers that define this gap 145 further apart and/or by decreasing the size of these rollers).

When provided, the upward coating apparatus 55 can be any type of upward coating apparatus. For example, this upward coating apparatus 55 can be a sputter coating apparatus, an ion beam coating deposition apparatus, an evaporation coating apparatus, a chemical vapor deposition apparatus, or any other apparatus that is adapted for performing an upward coating operation.

Figure 4:
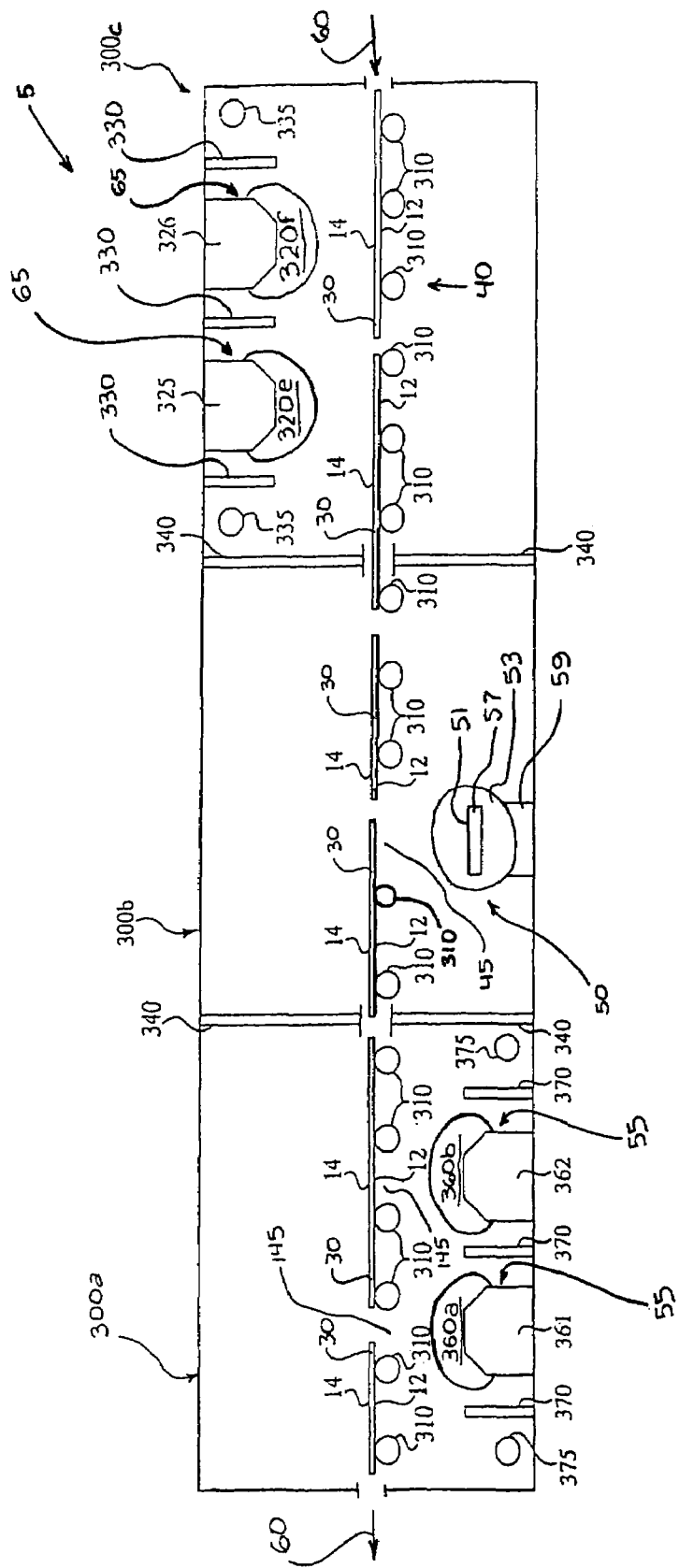
FIG. 4 illustrates another coater having disposed therein a downward coating apparatus, an ion gun, and an upward coating apparatus in accordance with certain embodiments of the invention.
Figure 5:
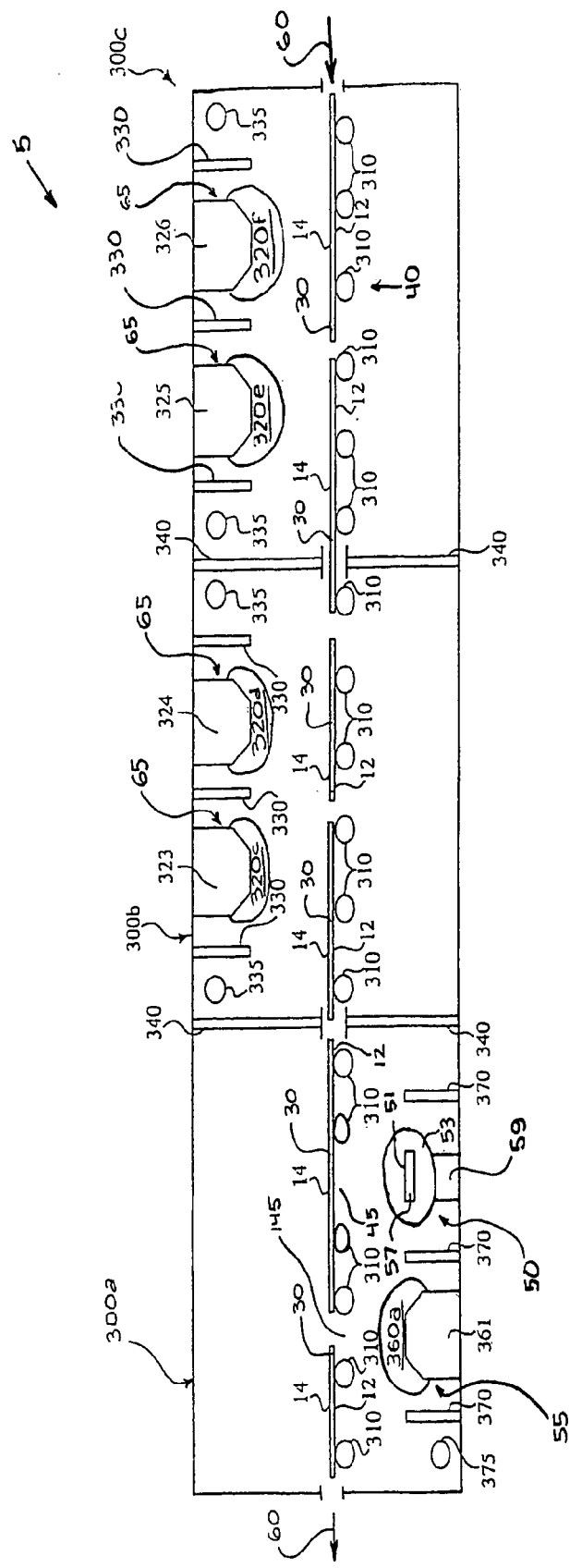
FIG. 5 illustrates a further coater having disposed therein a downward coating apparatus, an ion gun, and an upward coating apparatus in accordance with certain embodiments of the invention.
Figure 6:
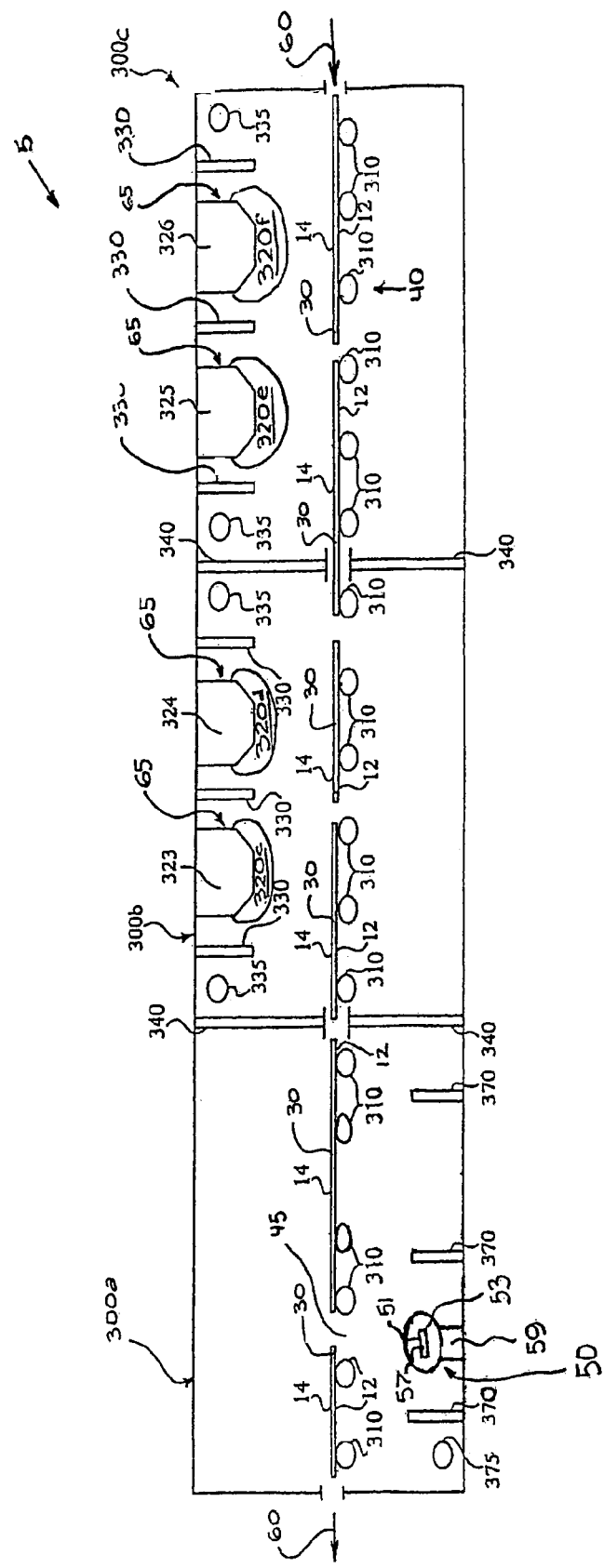
FIG. 6 illustrates a coater having disposed therein a downward coating apparatus and an ion gun in accordance with certain embodiments of the invention.

In certain preferred embodiments, the optional upward coating apparatus 55 is an upward sputtering apparatus. For example, this apparatus 55 may include a lower sputtering target 360, 360a, 360b positioned beneath the path of substrate travel. This upward coating apparatus may include a lower gas distribution system (e.g., comprising at least one gas-delivery outlet) adapted for delivering sputtering gas to the lower region of the coater (i.e., the region of the coater below the path of substrate travel). This is perhaps best appreciated with reference to FIGS. 4 and 5, wherein the illustrated coaters include lower sputtering targets 360a, 360b and lower gas distribution pipes 375 adjacent the lower targets. Also shown in FIGS. 4 and 5 are optional lower anodes 370, which preferably are below the path of substrate travel. When provided, the lower anodes 370 are typically positioned adjacent the lower targets 360, 360a, 360b. Upward sputtering systems are described in U.S. patent application Ser. Nos. 09/868,542, 09/868,543, 09/979,314, 09/572,766, and 09/599,301.

In other embodiments, the optional upward coating apparatus 55 is an evaporation coating apparatus. An apparatus 55 of this nature typically comprises a source of coating material to be evaporated. This source material will typically be positioned beneath the path of substrate travel 60. The source material can be provided in the form of a boat, crucible, strip, or coil that contains, or is formed of, the desired source material. Means are also typically provided for delivering energy to such source material. For example, the source material may be provided in conjunction with a heat source adapted for heating such material by direct or indirect resistance, by thermal conduction, by radiation or induction, by electron beam, or by laser irradiation or arcing.

Various processes for coating substrates by evaporation are known in the art. Briefly, evaporation is a form of physical vapor deposition that involves delivering energy to a source material in vacuum until it evaporates at adequate rates. The source material is transported in residual gas phase to the substrate, where such gas phase material condenses upon the substrate and forms the desired coating. When the optional upward coating apparatus 55 is an evaporation apparatus, it may be desirable to maintain the chamber at pressures on the order of between about $10^{-6}$ mbar. and about $10^{-4}$ mbar.

In other embodiments, the optional upward coating apparatus 55 is a chemical vapor deposition (i.e., CVD) apparatus. An apparatus of this nature typically comprises a gas outlet for delivering precursor gas to the lower region of the coater. Preferably, this gas outlet is positioned below the path of the substrate travel 60, such that from the precursor gas, coating material condenses upon the bottom surface of the substrate 30. A CVD apparatus of this nature will typically comprise a gas supply from which the precursor gas is delivered through the gas outlet and into the lower region of the coater. Any known CVD apparatus can be used. If so desired, this upward coating apparatus can be a plasma-enhanced chemical vapor deposition apparatus of the type described in U.S. patent application Ser. No. 10/373,703, entitled "Plasma-Enhanced Film Deposition" (Hartig), filed on Dec. 18, 2002.

In certain embodiments, the upward coating apparatus 55 comprises an ion gun. This ion gun can be part of any known ion-assisted deposition (i.e., IAD) process. For example, this ion gun can be part of an ion beam sputter deposition source comprising a sputtering target against which this ion gun accelerates ions, such that atoms of the target material are ejected from the target upwardly toward the substrate. Alternatively, this ion gun can be part of an ion-assisted evaporation apparatus, such as those disclosed in the publication "Ion-Based Methods For Optical Thin Film Deposition" (Journal of Material Science; J. P. Marting, 21 (1986) 1-25), the entire teachings of which are incorporated herein by reference. These types of IAD methods are known in the art, as are various other suitable IAD methods.

In certain embodiments, the coater 5 comprises a downward coating apparatus 65 that is adapted for coating a top major surface 14 of the substrate 30. Embodiments of this nature are exemplified in FIGS. 3-6. In such embodiments, the ion gun 50 is preferably positioned (e.g., mounted) at a location further along the path of substrate travel 60 than the downward coating apparatus 65. The ion gun 50 is thus adapted for removing, substantially if not entirely, from the bottom major surface of the substrate oversprayed coating that has been inadvertently deposited upon marginal portions of the bottom major surface of the substrate during operation of the downward coating apparatus. In the present embodiments (which involve a downward coating apparatus, together with an ion gun positioned below the path of substrate travel at a location further along the path of substrate travel than the downward coating apparatus), no upward coating apparatus is required in the coater. However, in FIGS. 3-5, an optional upward coating apparatus 55 is positioned at a location further along the path of substrate travel 60 than the ion gun 50. Thus, any oversprayed coating on the bottom surface 12 of the substrate 30 can be substantially, if not entirely, removed before this surface 12 is coated during operation of the optional upward coating apparatus 55.

When provided, the downward coating apparatus 65 can be any type of downward coating apparatus. In certain preferred embodiments, the downward coating apparatus 65 is a downward sputtering apparatus. In such embodiments, the downward sputtering apparatus comprises an upper sputtering target 320, 320c, 320d, 320e, 320f positioned above the path of substrate travel 60. Conjointly, the coater can be provided with upper gas distribution pipes 335 (e.g., having outlets that are) positioned above the path of substrate travel 60. It will typically be preferred to also provide upper anodes 330 above the path of substrate travel 60. When provided, the upper anodes 330 are preferably positioned adjacent upper targets. As noted above, each target in FIGS. 2-6 is depicted as being a cylindrical target, although planar targets can be used as well.

In other embodiments, the optional downward coating apparatus 65 comprises a chemical vapor deposition apparatus. Such an apparatus may comprises a gas delivery outlet for delivering precursor gas to the upper region of the coater (i.e., the region of the coater above the path of substrate travel). Preferably, this gas outlet is positioned above the path of substrate travel 60, such that from the precursor gas, coating material condenses upon the top major surface 14 of the substrate 30. A CVD apparatus of this nature will typically comprise a gas supply from which the precursor gas is delivered through the gas outlet and into the upper region of the coater. If so desired, this downward coating apparatus can be a plasma-enhanced chemical vapor deposition apparatus of the type described in U.S. patent application Ser. No. 10/373,703, entitled "Plasma-Enhanced Film Deposition" (Hartig), filed on Dec. 18, 2002.

In certain embodiments, the downward coating apparatus comprises an upper ion gun. This upper ion gun can be part of any desired downward ion-assisted deposition process. For example, this upper ion gun can be part of an ion beam sputter deposition source comprising a sputtering target against which this ion gun accelerates ions, such that atoms of the target material are ejected from the target downwardly toward the substrate. This type of IAD method is known in the art, as are various other suitable IAD methods.

It has been discovered that the bottom surface of a substrate can be coated inadvertently due to overspray from a downward coating operation. For example, when material is sputtered downwardly onto the top surface of a substrate, some of the sputtered material can actually find its way onto the bottom surface of the substrate. This phenomenon has been found to leave unwanted coating on marginal portions of the substrate's bottom surface. This can create an undesirable picture frame effect on the substrate. Further, if a desired coating is subsequently applied to the bottom surface by an upward coating operation, the marginal portions of this surface will end up carrying both the desired coating and the unwanted oversprayed coating, while the central portion of this surface carries only the desired coating. This non-uniformity/picture frame effect can have a variety of adverse effects on the intended coating properties/the desired specifications.

These particular overspray problems can be eliminated by positioning the ion gun 50 further along the path of substrate travel 60 (preferably at a location beyond where the substrate is exposed to film deposition from the downward coating apparatus) than the downward coating apparatus 65. This enables the ion gun 50 to remove from the bottom surface 12 of the substrate 30 oversprayed coating (in some cases, the ion gun is operated so it also mills away a small thickness of glass from the bottom surface of a glass substrate) that has been inadvertently deposited on marginal portions of the substrate's bottom surface 12 during operation of the downward coating apparatus 65. This also tends to substantially reduce, if not eliminate, any traces of contact on the substrate's bottom surface that may have resulted from conveying the substrate through the coater on the substrate support. If an upward coating apparatus 55 is also provided, it is preferably located further along the path of substrate travel 60 than the ion gun 50. This enables the ion gun 50 to remove (substantially if not entirely) from the bottom surface 12 of the substrate 30 oversprayed coating that has been inadvertently deposited on marginal portions of the substrate's bottom surface 12 during operation of the downward coating apparatus 65 before this surface 12 is coated during operation of the upward coating apparatus 55.

It has also been discovered that a further overspray problem can result when coating is applied upwardly onto the bottom surface 12 of a substrate 30 before coating is applied downwardly onto the top surface 14 of the substrate 30. In particular, the desired coating properties on the substrate's bottom surface 12 can be compromised when material from the downward coating operation oversprays the coating that has previously been applied upwardly onto the substrate's bottom surface 12. Even if such oversprayed material has no apparent (e.g., readily visible to the naked eye) effect on the coated substrate, it can compromise the desired properties of the coated substrate. This can be particularly problematic when the substrate's bottom surface is intended to have particular surface properties (e.g., when the substrate's bottom surface is intended to carry a surface-effect coating), such as photoactivity, hydrophilicity, hydrophobicity, or the like. The oversprayed coating on the substrate's bottom surface may nullify or reduce such intended surface properties.

To obviate this problem, the upward coating apparatus 55 can optionally be disposed in a final chamber (in some cases, in the final deposition zone of the final chamber) of the coater. This final chamber may be the last chamber along the path of substrate travel 60. Alternatively, this final chamber may be the last operating chamber (i.e., the last chamber in which any film deposition operation is performed) along the path of substrate travel. In such cases, the coater may include one or more non-operated chambers further along the path of substrate travel. The inventors have discovered these embodiments to be advantageous in that once this upward coating apparatus is operated to apply a desired coating on the bottom major surface of the substrate, this desired coating will not be subjected to any subsequent overspray, such as may otherwise occur if the thus-coated substrate were subsequently conveyed into an active (i.e., operated) downward coating zone. Thus, in certain embodiments, operation of the upward coating apparatus is performed after all other coating of the substrate in the coater has been performed. Similarly, in certain embodiments, the substrate is not conveyed beneath any operating/operated downward coating apparatus in the coater after the operation of the upward coating apparatus, such that marginal portions of coating applied to the bottom major surface of the substrate will not be concealed by oversprayed coating from any subsequent downward coating apparatus in the coater.

In certain embodiments wherein an upward coating apparatus is provided, the coater 5 is operated so as to deposit upon the bottom major surface of the substrate a coating (which in some cases comprises at least some high index film having a refractive index of at least about 2.3) having a total optical thickness of less than about 690Å. In these embodiments, any traces of contact left on this coating from the substrate support will tend to be invisible or at least very difficult to perceive. In some embodiments of this nature, the coater 5 is operated such that the top major surface of the substrate is also coated with a coating, preferably with one having a total optical thickness of at least about 1,000Å. In certain embodiments of this nature, wherein the coater has at least one upward coating apparatus and a plurality of downward coating apparatuses, the coater is operated to deposit a low-emissivity coating on the top major surface of the substrate and to deposit a surface-effect coating on the bottom major surface of the substrate. Here, the surface-effect coating is preferably selected from the group consisting of a photocatalytic coating, a hydrophilic coating, and a hydrophobic coating. In some embodiments of this nature, the surface-effect coating comprises titanium oxide and/or silicon oxide. In one such embodiment, the surface-effect coating is a photocatalytic coating comprising titanium oxide.

Low-emissivity coatings are well known in the art and typically include at least one region of infrared-reflective film sandwiched between at least two regions of transparent dielectric film. The infrared-reflective film, which typically comprises a conductive metal such as silver, gold, or copper, reduces the transmission of radiant heat through the coating. The transparent dielectric film is used primarily to reduce visible reflectance and to control other properties of the coatings, such as color. Commonly used transparent dielectrics include oxides of zinc, tin, indium, bismuth, and titanium, and alloys and mixtures thereof, as well as certain nitrides (e.g., silicon nitride). Useful low-emissivity coatings are described in U.S. patent application Ser. No. 09/728,435, the entire teachings of which are incorporated herein by reference.

Photocatalytic coatings typically comprise a semiconductor that can absorb ultraviolet radiation and can photocatalytically degrade organic materials such as oil, plant matter, fats, and greases. The most powerful of the photocatalysts appears to be titanium oxide (e.g., titanium dioxide). Useful photocatalytic coatings are described in U.S. Pat. No. 5,874,701 (Watanabe et al), U.S. Pat. No. 5,853,866 (Watanabe et al), U.S. Pat. No. 5,961,843 (Hayakawa et al.), U.S. Pat. No. 6,139,803 (Watanabe et al), U.S. Pat. No. 6,191,062 (Hayakawa et al.), U.S. Pat. No. 5,939,194 (Hashimoto et al.), U.S. Pat. No. 6,013,372 (Hayakawa et al.), U.S. Pat. No. 6,090,489 (Hayakawa et al.), U.S. Pat. No. 6,210,779 (Watanabe et al), U.S. Pat. No. 6,165,256 (Hayakawa et al.), and U.S. Pat. No. 5,616,532 (Heller et al.), the entire contents of each of which are incorporated herein by reference.

Hydrophilic coatings have an affinity for water and tend to cause water applied to such coatings to sheet. Useful hydrophilic coatings are described in U.S. patent applications Ser. Nos. 09/868,542, 09/868,543, 09/599,301, and 09/572,766, the entire contents of each of which are incorporated herein by reference.

Hydrophobic coatings are applied to glass to repel water, thus causing water on such coatings to bead up, rather than spreading into a sheet. Useful hydrophobic coatings are described in U.S. Pat. No. 5,424,130, issued to Nakanishi, et al., the entire teachings of which are incorporated herein by reference.

As noted above, the invention provides certain embodiments wherein the coater includes an upward coating apparatus that is positioned beneath the path of substrate travel at a location further along the path of substrate travel than the ion gun. In some such embodiments, the invention comprises operating the upward coating apparatus to coat the bottom major surface of the substrate after the ion gun has been operated to treat the bottom major surface of the substrate. In some embodiments of this nature, operation of the upward coating apparatus comprises depositing on the bottom major surface of the substrate a surface-effect coating selected from the group consisting of a photocatalytic coating, a hydrophilic coating, and a hydrophobic coating. In these embodiments, the coater need not have any downward coating apparatus. In some cases, the surface-effect coating comprises titanium oxide and/or silicon oxide. For example, the surface-effect coating in one such case is a photocatalytic coating comprising titanium oxide.

Thus, in certain embodiments, an upward coating apparatus 55 in the coater 5 is adapted for depositing a high quality photocatalytic coating onto the bottom surface 12 of the substrate 30 after ion bombarding this surface 12 using a preceding ion gun 50. In these embodiments, the upward coating apparatus 55 that is adapted for depositing the photocatalytic coating onto the bottom surface 12 of the substrate 30 is located further along the path of substrate travel than the ion gun 50. In certain preferred embodiments, a particularly thin high quality photocatalytic coating is deposited on the bottom surface of the substrate using this upward coating apparatus after the bottom surface has been ion treated using the ion gun 50. In these embodiments, the thin high quality photocatalytic film preferably is deposited at a total optical thickness of less than about 690Å.

Thus, in certain embodiments, the optional upward coating apparatus 55 is adapted for applying a photocatalytic coating. In some embodiments of this nature, the upward coating apparatus 55 is adapted for applying a photocatalytic coating that comprises (perhaps more preferably consists essentially of, and perhaps optimally consists of) titanium oxide. In these embodiments, the upward coating apparatus desirably comprises a source or sources of titanium and oxygen. For example, the upward coating apparatus 55 can optionally include a lower sputtering target comprising titanium (e.g., metallic titanium or titanium oxide). Conjointly, the lower region of the coater adjacent such target can optionally be provided with an oxidizing atmosphere. With photocatalytic titanium oxide coatings and other high index photocatalysts in particular, it is especially desirable not to subject such coatings to subsequent overspraying, as overspray on such coatings will tend to be more visible than overspray on other types of coatings, due to the somewhat reflective nature of these coatings.

In certain advantageous embodiments, the optional upward coating apparatus 55 comprises a lower sputtering target of the nature described in U.S. patent application Ser. No. 60/262,878, the entire teachings of which are incorporated herein by reference.

If a photocatalytic coating applied to the bottom major surface of a substrate is subjected to overspray from a subsequent downward coating operation, the desired photocatalytic properties can be jeopardized. Thus, in embodiments wherein a photocatalytic coating is applied to the bottom major surface of a substrate by an upward coating operation, this upward coating operation is desirably not followed by any subsequent downward coating operation in the coater.

In embodiments of the invention wherein one apparatus (e.g., an ion gun or a coating apparatus) is at a location further along the path of substrate travel than another apparatus (e.g., an ion gun or a coating apparatus), these apparatuses are of course not vertically aligned directly above/below each another. Preferably, though not necessarily, they are in separate deposition zones (which may be isolated from each other by gas separation and/or a curtain, wall, or other divider), and in some cases they are in separate chambers of the coater. The term "titanium-containing" material refers to any material that includes at least some titanium (the same convention is used for other materials). When the ion gun 50 is used to clean the bottom surface of the substrate, argon or another inert gas is preferably used for the cleaning (i.e., Ar gas is used in the ion gun to accelerate Ar+ ions toward the substrate's bottom surface). In some cases, the ion gun when used to clean the bottom surface of the substrate is operated to produce an ion beam having an ion energy of between about 300 eV and about 5,000 eV, perhaps more preferably between about 1,500 eV and about 2,000 eV, and perhaps optimally between about 1,400 eV and about 1,600 eV. Preferably, the ion gun is operated to produce an ion bean that impinges the substrate's bottom surface at an angle of about 90 degrees, or elsewhere within a range of between about 30 and about 90 degrees. In certain embodiments, the substrate is fully processed (e.g., both of its major surfaces can be coated) in a single pass through the coater 5.

While there have been described what are believed to be preferred embodiments of the present invention, those skilled in the art will recognize that other and further changes and modifications can be made without departing from the spirit of the invention, and all such changes and modifications should be understood to fall within the scope of the invention.

What is claimed is:

1. A method of processing a sheet-like glass substrate, the sheet-like glass substrate having a top major surface and an opposite, bottom major surface, the method comprising:
   a) providing a coater adapted for applying coating onto the substrate, the coater comprising a substrate support defining a path of substrate travel extending through the coater, a downward coating apparatus positioned above the path of substrate travel, and an ion gun positioned beneath the path of substrate travel, wherein the ion gun is at a location further along the path of substrate travel than the downward coating apparatus;
   b) conveying the substrate along the path of substrate travel;
   c) operating the downward coating apparatus to coat the top major surface of the substrate; and
   d) operating the ion gun to emit an ion beam toward the bottom major surface of the substrate, said operation of the ion gun being performed to treat the bottom major surface of the substrate as the substrate travels the path of substrate travel so that the entire bottom major surface of the substrate will have been treated once travel of the substrate past the ion gun is complete to remove any oversprayed coating that was inadvertently deposited upon marginal portions of the bottom major surface of the substrate during said operation of the downward coating apparatus.

2. The method of claim 1 wherein the substrate is maintained in a horizontal orientation during said conveyance of the substrate along the path of substrate travel.

3. The method of claim 1 wherein the substrate is a sheet of glass that is on the substrate support during said conveyance, and wherein other sheets of glass are also on the substrate support, such sheets of glass being spaced-apart from one another on the substrate support and conveyed in such a spaced-apart configuration.

4. The method of claim 1 wherein the substrate support comprises a plurality of spaced-apart transport rollers, the method comprising rotating at least one of the transport rollers to achieve said conveyance of the substrate along the path of substrate travel.

5. The method of claim 4 wherein said operation of the ion gun emits said ion beam upwardly between an adjacent pair of the spaced-apart transport rollers.

6. The method of claim 1 wherein the downward coating apparatus is a downward sputtering apparatus comprising an upper sputtering target positioned above the path of substrate travel, and wherein said operation of the downward coating apparatus comprises establishing a plasma adjacent said upper sputtering target.

7. The method of claim 1 wherein the downward coating apparatus is a chemical vapor deposition apparatus, and wherein said operation of the downward coating apparatus comprises delivering precursor gas to an upper region of the coater.

8. The method of claim 1 wherein the downward coating apparatus comprises an upper ion gun, the upper ion gun being adapted for ion beam coating deposition, and wherein said operation of the downward coating apparatus comprises operating the upper ion gun to emit an ion beam toward the top major surface of the substrate.

9. The method of claim 1 further comprising an upward coating apparatus, the upward coating apparatus being positioned beneath the path of substrate travel at a location further along the path of substrate travel than the ion gun, the method comprising operating the upward coating apparatus to coat the bottom major surface of the substrate after said operation of said ion gun has removed any oversprayed coating from the bottom major surface of the substrate.

10. The method of claim 9 wherein said operation of the upward coating apparatus is performed after all other coating of the substrate in the coater has been performed.

11. The method of claim 9 wherein the substrate is not conveyed beneath any operating downward coating apparatus in the coater after said operation of the upward coating apparatus, such that marginal portions of coating applied to the bottom major surface of the substrate will not be concealed by oversprayed coating from any subsequent downward coating apparatus in the coater.

12. The method of claim 9 wherein said operation of the upward coating apparatus is performed in a final chamber of the coater.

13. The method of claim 9 wherein the bottom major surface of the substrate is coated with a coating having a total optical thickness of less than about 690Å.

14. The method of claim 13 wherein the top major surface of the substrate is coated with a coating having a total optical thickness of at least about 1,000Å.

15. The method of claim 9 wherein said operation of the upward coating apparatus comprises depositing on the bottom major surface of the substrate a surface-effect coating selected from the group consisting of a photocatalytic coating, a hydrophilic coating, and a hydrophobic coating.

16. The method of claim 15 wherein the surface-effect coating comprises titanium oxide and/or silicon oxide.

17. The method of claim 16 wherein the surface-effect coating is a photocatalytic coating comprising titanium oxide.

18. The method of claim 9 wherein the upward coating apparatus is an upward sputtering apparatus comprising a lower sputtering target positioned beneath the path of substrate travel, and wherein said operation of the upward coating apparatus comprises establishing a plasma adjacent said lower sputtering target.

19. The method of claim 9 wherein the upward coating apparatus is an evaporation coating apparatus, and wherein said operation of the upward coating apparatus comprises positioning a source of coating material to be evaporated in a lower region of the coater.

20. The method of claim 9 wherein the upward coating apparatus is a chemical vapor deposition apparatus, and wherein said operation of the upward coating apparatus comprises delivering precursor gas to a lower region of the coater.

21. The method of claim 9 wherein the upward coating apparatus comprises a further ion gun, said further ion gun being adapted for ion beam coating deposition, and wherein said operation of the upward coating apparatus comprises operating said further ion gun to emit an ion beam toward the bottom major surface of the substrate.

22. The method of claim 1 wherein the operating the ion gun to emit an ion beam towards a bottom major surface of the substrate comprises emitting ions from said ion gun that span substantially the entire width of said bottom major surface.

23. The method of claim 1 wherein the ion gun is part of a plurality of ion guns, and the operating the ion gun to emit an ion beam towards a bottom major surface of the substrate comprises emitting ions from said plurality of ion guns that span substantially the entire width of said bottom major surface.

24. A method of processing a sheet-like glass substrate, the sheet-like glass substrate having a top major surface and an opposite, bottom major surface, the method comprising:
   a) providing a coater adapted for applying coating onto the substrate, the coater comprising a substrate support defining a path of substrate travel extending through the coater, wherein an ion gun is positioned beneath the path of substrate travel, and wherein an
   upward coating apparatus is positioned beneath the path of substrate travel at a location further along the path of substrate travel than the ion gun;
   b) conveying the substrate along the path of substrate travel;
   c) operating the ion gun to emit an ion beam toward the bottom major surface of the substrate, the ion beam comprising accelerated ions that strike the bottom major surface of the substrate as the substrate travels the path of substrate travel so that the entire bottom major surface of the substrate will have been treated once travel of the substrate past the ion gun is complete; and
   d) operating the upward coating apparatus to deposit a photocatalytic coating on the bottom major surface of the substrate.

25. The method of claim 24 wherein the upward coating apparatus is an upward sputtering apparatus comprising a lower sputtering target positioned beneath the path of substrate travel, the lower target being sputtered to deposit the photocatalytic coating on the bottom major surface of the substrate.

26. The method of claim 25 wherein the lower target comprises a titanium-containing target material, the lower target being sputtered in an oxidizing atmosphere.

27. The method of claim 24 wherein the photocatalytic coating is deposited so as to have a total optical thickness of less than about 690Å.

28. The method of claim 24 wherein said operation of the upward coating apparatus to apply the photocatalytic coating is performed after all other coating of the substrate in the coater has been performed.

29. The method of claim 24 wherein the substrate is not conveyed beneath any operating downward coating apparatus in the coater after said operation of the upward coating apparatus, such that marginal portions of coating applied to the bottom major surface of the substrate will not be concealed by oversprayed coating from any subsequent downward coating apparatus in the coater.

30. The method of claim 24 wherein said operation of the upward coating apparatus is performed in a final chamber of the coater.

31. The method of claim 24 wherein the ion gun is at a location further along the path of substrate travel than a downward coating apparatus, the method comprising operating the downward coating apparatus to coat a top major surface of the substrate, said operation of the ion gun being performed to remove from the bottom major surface of the substrate oversprayed coating inadvertently deposited upon marginal portions of the bottom major surface of the substrate during said operation of the downward coating apparatus.

32. The method of claim 24 wherein the ion beam comprises accelerated ions that span substantially the entire width of said bottom major surface of the substrate.

33. A method of processing a sheet-like substrate, the method comprising:
   a) providing a coater adapted for applying coating onto the substrate, the coater comprising a substrate support defining a path of substrate travel extending through the coater, a downward coating apparatus positioned above the path of substrate travel, an ion gun positioned beneath the path of substrate travel, wherein the ion gun is at a location further along the path of substrate travel than the downward coating apparatus, and an upward coating apparatus positioned beneath the path of substrate travel at a location farther along the path of substrate travel than the ion gun, the method comprising:
   b) conveying the substrate along the path of substrate travel;
   c) operating the downward coating apparatus to coat a top major surface of the substrate;
   d) operating the ion gun to emit an ion beam toward a bottom major surface of the substrate, said operation of the ion gun being performed to remove from the bottom major surface of the substrate any oversprayed coating that was inadvertently deposited upon marginal portions of the bottom major surface of the substrate during said operation of the downward coating apparatus; and
   e) operating the upward coating apparatus to coat the bottom major surface of the substrate after said operation of said ion gun has removed any oversprayed coating from the bottom major surface of the substrate, wherein said operation of the upward coating apparatus is performed after all other coating of the substrate in the coater has been performed.

34. The method of claim 33 wherein the operating the ion gun to emit an ion beam toward a bottom major surface of the substrate comprises emitting ions from said ion gun that span substantially the entire width of said bottom major surface.

35. The method of claim 33 wherein the substrate is maintained in a horizontal orientation during said conveyance of the substrate along the path of substrate travel.

36. The method of claim 33 wherein the substrate support comprises a plurality of spaced-apart transport rollers, the method comprising rotating at least one of the transport rollers to achieve said conveyance of the substrate along the path of substrate travel.

37. The method of claim 36 wherein said operation of the ion gun emits said ion beam upwardly between an adjacent pair of the spaced-apart transport rollers.

38. The method of claim 33 wherein the downward coating apparatus is a downward sputtering apparatus comprising an upper sputtering target positioned above the path of substrate travel, and wherein said operation of the downward coating apparatus comprises establishing a plasma adjacent said upper sputtering target.

39. The method of claim 33 wherein said operation of the upward coating apparatus is performed in a final chamber of the coater.

40. The method of claim 33 wherein said operation of the upward coating apparatus comprises depositing on the bottom major surface of the substrate a surface-effect coating selected from the group consisting of a photocatalytic coating, a hydrophilic coating, and a hydrophobic coating.

41. The method of claim 33 wherein the upward coating apparatus is an upward sputtering apparatus comprising a lower sputtering target positioned beneath the path of substrate travel, and wherein said operation of the upward coating apparatus comprises establishing a plasma adjacent said lower sputtering target.

42. A method of processing a sheet-like substrate, the method comprising:
   a) providing a coater adapted for applying coating onto the substrate, the coater comprising a substrate support defining a path of substrate travel extending through the coater, wherein an ion gun is positioned beneath the path of substrate travel, and wherein an upward coating apparatus is positioned beneath the path of substrate travel at a location further along the path of substrate travel than the ion gun;
   b) conveying the substrate along the path of substrate travel;
   c) operating the ion gun to emit an ion beam toward a bottom major surface of the substrate, the ion beam comprising accelerated ions that strike the bottom major surface of the substrate; and
   d) operating the upward coating apparatus to deposit a photocatalytic coating on the bottom major surface of the substrate, wherein said operation of the upward coating apparatus to apply the photocatalytic coating is performed after all other coating of the substrate in the coater has been performed.

43. The method of claim 42 wherein the substrate is maintained in a horizontal orientation during said conveyance of the substrate along the path of substrate travel.

44. The method of claim 42 wherein the substrate support comprises a plurality of spaced-apart transport rollers, the method comprising rotating at least one of the transport rollers to achieve said conveyance of the substrate along the path of substrate travel.

45. The method of claim 44 wherein said operation of the ion gun emits said ion beam upwardly between an adjacent pair of the spaced-apart transport rollers.

46. The method of claim 42 wherein the downward coating apparatus is a downward sputtering apparatus comprising an upper sputtering target positioned above the path of substrate travel, and wherein said operation of the downward coating apparatus comprises establishing a plasma adjacent said upper sputtering target.

47. The method of claim 42 wherein the upward coating apparatus is an upward sputtering apparatus comprising a lower sputtering target positioned beneath the path of substrate travel, the lower target being sputtered to deposit the photocatalytic coating on the bottom major surface of the substrate.

48. The method of claim 47 wherein the lower target comprises a titanium-containing target material, the lower target being sputtered in an oxidizing atmosphere.

49. The method of claim 42 wherein said operation of the upward coating apparatus is performed in a final chamber of the coater.

50. The method of claim 42 wherein the operating the ion gun to emit an ion beam toward a bottom major surface of the substrate comprises emitting ions from said ion gun that span substantially the entire width of said bottom major surface.

* * * * *